(12) United States Patent
Seo et al.

(10) Patent No.: US 10,950,549 B2
(45) Date of Patent: Mar. 16, 2021

(54) ILD GAP FILL FOR MEMORY DEVICE STACK ARRAY

(71) Applicant: International Business Machines Corporation, Armonk, NY (US)

(72) Inventors: Soon-Cheon Seo, Glenmont, NY (US); Injo Ok, Loudonville, NY (US); Alexander Reznicek, Troy, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/193,826

(22) Filed: Nov. 16, 2018

(65) Prior Publication Data
US 2020/0161250 A1  May 21, 2020

(51) Int. Cl.
| | |
|---|---|
| *H01L 23/532* | (2006.01) |
| *H01L 27/22* | (2006.01) |
| *H01L 43/02* | (2006.01) |
| *H01L 43/12* | (2006.01) |
| *H01L 21/311* | (2006.01) |
| *H01L 23/528* | (2006.01) |
| *H01L 21/3105* | (2006.01) |
| *H01L 27/24* | (2006.01) |
| *H01L 27/11502* | (2017.01) |

(52) U.S. Cl.
CPC .. *H01L 23/53295* (2013.01); *H01L 21/31055* (2013.01); *H01L 21/31116* (2013.01); *H01L 23/528* (2013.01); *H01L 27/222* (2013.01); *H01L 43/02* (2013.01); *H01L 43/12* (2013.01); *H01L 27/11502* (2013.01); *H01L 27/2463* (2013.01)

(58) Field of Classification Search
CPC ............. H01L 23/53295; H01L 43/08
USPC ............................. 257/421; 438/3
See application file for complete search history.

(56) References Cited

U.S. PATENT DOCUMENTS

| | | | |
|---|---|---|---|
| 6,340,435 B1 | 1/2002 | Bjorkman et al. | |
| 6,358,756 B1 * | 3/2002 | Sandhu ................ | B82Y 10/00 257/E21.665 |
| 6,605,546 B1 * | 8/2003 | Subramanian .... | H01L 21/76808 134/1.2 |
| 6,680,500 B1 | 1/2004 | Low et al. | |
| 6,946,698 B1 | 9/2005 | Lin | |
| 7,041,748 B2 | 5/2006 | Lin et al. | |
| 7,863,593 B2 * | 1/2011 | Happ ................ | H01L 45/06 257/2 |
| 9,136,273 B1 * | 9/2015 | Purayath ............. | H01L 27/115 |
| 9,190,260 B1 | 11/2015 | Zhang et al. | |
| 9,647,200 B1 | 5/2017 | Annunziata et al. | |

(Continued)

OTHER PUBLICATIONS

Gaidis, M. C., et al., "Two-level BEOL processing for rapid iteration in MRAM development", IBM J. Res. & Dev., Jan. 2006, vol. 50 No. 1.

*Primary Examiner* — Jami Valentine Miller
(74) *Attorney, Agent, or Firm* — Scully, Scott, Murphy & Presser, P.C.; L. Jeffrey Kelly, Esq.

(57) ABSTRACT

A dual interlayer dielectric material structure is located on a passivation dielectric material liner and entirely fills a gap located between each memory device stack of a plurality of memory device stacks. The dual interlayer dielectric material structure includes, from bottom to top, a first void free low-k interlayer dielectric (ILD) material and a second void free low-k ILD material.

10 Claims, 4 Drawing Sheets

(56) References Cited

U.S. PATENT DOCUMENTS

| | | |
|---|---|---|
| 9,722,174 B1 | 8/2017 | Nagel et al. |
| 9,960,181 B1 | 5/2018 | Cui et al. |
| 9,972,771 B2 | 5/2018 | Mo et al. |
| 9,991,161 B1* | 6/2018 | Sun .................. H01L 23/49827 |
| 10,043,819 B1 | 8/2018 | Lai et al. |
| 2005/0059245 A1* | 3/2005 | Spencer ............ H01L 21/31633 |
| | | 438/689 |
| 2013/0119494 A1 | 5/2013 | Li et al. |
| 2013/0248800 A1 | 9/2013 | Tang et al. |
| 2015/0262868 A1* | 9/2015 | Ting .................. H01L 21/7682 |
| | | 257/288 |
| 2019/0165173 A1* | 5/2019 | Liu .................... H01L 29/7848 |

\* cited by examiner

ILD GAP FILL FOR MEMORY DEVICE STACK ARRAY

BACKGROUND

The present application relates to a semiconductor structure and a method of forming the same. More particularly, the present application relates to a semiconductor structure including a plurality of memory device stacks located in the back-end-of the-line (BEOL) and contained within a dual interlayer dielectric (ILD) material structure that is devoid of voids (i.e., void free). The present application also relates to a method of forming such a semiconductor structure.

Non-damascene memory device stacks in the BEOL is challenging for ILD material gap fill. Encapsulation (i.e., passivation) is required to protect each memory device stack prior to ILD material deposition. Gap filling of high incoming topography is an issue using existing ILD materials having a low dielectric constant (i.e., dielectric constant of less than 4.0). Thick encapsulation can reduce topography. However, thick encapsulation can increase parasitic capacitance of such structures.

There is thus a need for providing a semiconductor structure including a plurality of memory device stacks that are located in the back-end-of the-line (BEOL) that can eliminate the aforementioned concerns and achieve good gap filling.

SUMMARY

A dual interlayer dielectric material structure is located on a passivation dielectric material liner and entirely fills a gap located between each memory device stack of a plurality of memory device stacks. The dual interlayer dielectric material structure includes, from bottom to top, a first void free low-k interlayer dielectric (ILD) material and a second void free low-k ILD material.

One aspect of the present application relates to a semiconductor structure. In one embodiment, the semiconductor structure includes a memory device stack located on a surface of each electrically conductive structure of a plurality of electrically conductive structures that are embedded in an interconnect dielectric material layer and present in a memory device area. Each memory device stack includes a bottom electrode, a memory device pillar and a top electrode. A passivation dielectric material liner is located laterally adjacent to each memory device stack and on a surface of the interconnect dielectric material layer. A dual interlayer dielectric material structure is located on the passivation dielectric material liner and entirely fills a gap between each memory device stack. The dual interlayer dielectric material structure includes, from bottom to top, a first void free low-k interlayer dielectric (ILD) material and a second void free low-k ILD material.

In one embodiment, the first void free low-k ILD material is composed of a single ILD material having a low dielectric constant and an undulating top surface. In another embodiment, the first void free low-k interlayer dielectric (ILD) material is composed of a void filling low-k dielectric material filling an entirety of each void present in a first ILD material having a low dielectric constant.

Another aspect of the present application relates to a method of forming a semiconductor structure. In one embodiment, the method includes forming a memory device stack on a surface of each electrically conductive structure of a plurality of electrically conductive structures that are embedded in an interconnect dielectric material layer and present in a memory device area. Each memory device stack includes a bottom electrode, a memory device pillar and a top electrode. A passivation dielectric material layer is formed on the sidewalls and topmost surface of each memory device stack and on a surface of the interconnect dielectric material layer. A first interlayer dielectric (ILD) material having a low dielectric constant and voids is then formed on the passivation dielectric material layer and above each memory device stack. Next, the first ILD material and the passivation dielectric material layer are etched. The etch removes the voids from the first ILD material and physically exposes an upper portion of the top electrode of each memory device stack. A second ILD material having a low dielectric constant is then formed on the remaining first ILD material and the physically exposed upper portion of the top electrode of each memory device stack.

In another embodiment, the method includes forming a memory device stack on a surface of each electrically conductive structure of a plurality of electrically conductive structures that are embedded in an interconnect dielectric material layer and present in a memory device area. Each memory device stack includes a bottom electrode, a memory device pillar and a top electrode. A passivation dielectric material layer is formed on the sidewalls and topmost surface of each memory device stack and on a surface of the interconnect dielectric material layer. A first interlayer dielectric (ILD) material having a low dielectric constants and voids is then formed on the passivation dielectric material layer and above each memory device stack. An upper portion of the first ILD material and the passivation dielectric material layer located on a topmost surface of the top electrode of each memory device stack are removed by planarization. The removing physically exposes each void present in the first ILD material. Each void is then filled with a void filling low-k dielectric material, and thereafter the void filling low-k dielectric material is recessed to provide a void free low-k interlayer dielectric (ILD) material composed of the void filling low-k dielectric material filling an entirely of each void present in the first ILD material. A second ILD material having a low dielectric constant is then formed on the void free low-k interlayer dielectric (ILD) material.

DETAILED DESCRIPTION

Figure 1:
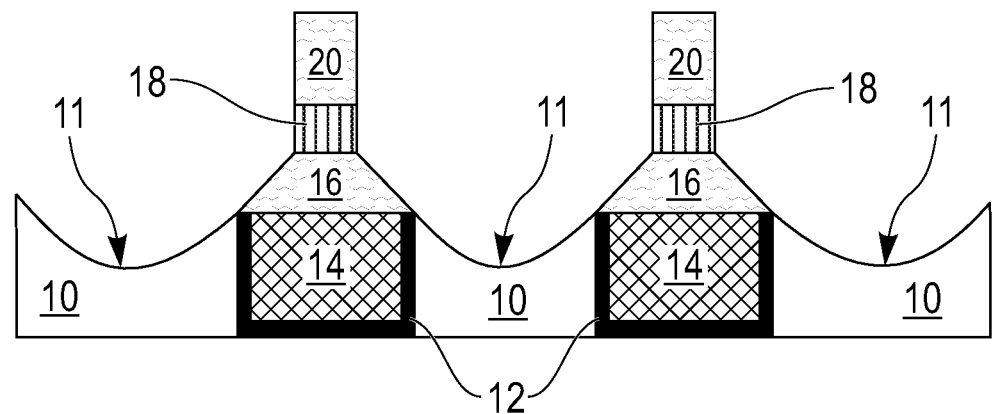
FIG. 1 is a cross sectional view of an exemplary semiconductor structure that can be employed in the present application and including a plurality of memory device stacks, each memory device stack is located on a surface of an electrically conductive structure that is embedded in an interconnect dielectric material layer and includes a bottom electrode, a memory device pillar, and a top electrode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure that can be employed in the present application. The exemplary semiconductor structure of FIG. 1 includes a plurality of memory device stacks material layer 10. Each memory device stack is located on a surface of an electrically conductive structure 14 that is embedded in the interconnect dielectric material layer 10 and includes a bottom electrode 16, a memory device pillar 18, and a top electrode 20. Each memory device stack (16/18/20) is spaced apart from each other by a gap.

It is noted that the drawings of the present application illustrate a memory device area in which a memory device array in accordance with the present application will be subsequently formed. A non-memory device area may be located laterally adjacent to the memory device area illustrated in the drawings of the present application.

The interconnect dielectric material layer 10 can be composed of any interconnect dielectric material including, for example, silicon dioxide, silsesquioxanes, C doped oxides (i.e., organosilicates) that includes atoms of Si, C, 0 and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

Each electrically conductive structure 14 that is embedded in the interconnect dielectric material layer 10 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner 12 is formed along the sidewalls and a bottom wall of each electrically conductive structure 14. In some embodiments, no diffusion barrier liner is present. The diffusion barrier liner 12 is composed of a diffusion barrier material (i.e., a material that serves as a barrier to prevent a conductive material such as copper from diffusing there through). Examples of diffusion barrier materials that can be used in providing the diffusion barrier liner 12 include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structures 14, and, if present, the diffusion barrier liner 12 may be formed utilizing conventional processes that are well-known to those skilled in the art. So as to not obscure the method of the present application, the techniques used to form the interconnect level including the interconnect dielectric material layer 10, the electrically conductive structures 14, and, if present, the diffusion barrier liner 12 are not provided herein. It is noted that at least one other interconnect level and/or a middle-of-the-line (MOL) level may be located beneath the interconnect level including the interconnect dielectric material layer 10, the electrically conductive structure 14s, and, if present, the diffusion barrier liner 12. These other levels are not shown for clarity.

As is shown, the bottom electrode 16 is located on a non-recessed surface of each of the electrically conductive structures 14. Each bottom electrode 16 may be composed of a conductive material such as, for example, Cu, Ta, TaN, Ti, TiN, Ru, RuN, RuTa, RuTaN, Co, CoWP, CoN, W, WN or any combination thereof. Each bottom electrode 16 may have a thickness from 2 nm to 80 nm; other thicknesses are possible and can be used in the present application as the thickness of the bottom electrodes 16. Each bottom electrode 16 may be formed by a deposition process such as, for example, sputtering, atomic layer deposition (ALD), chemical vapor deposition (CVD), plasma enhanced chemical vapor deposition (PECVD) or physical vapor deposition (PVD). A patterning process (such as, for example, photolithography and etching) may follow the deposition of the conductive material that provides each of the bottom electrodes 16.

A memory device pillar 18 and a top electrode 20 are then formed upon each bottom electrode 16. The memory device pillar 18 and top electrode 20 may be formed by depositing a material stack (not shown) that includes a memory device stack and a top electrode layer, and thereafter the stack is patterned by photolithography and etching. Photolithography includes forming a photoresist material (not shown) on a material or material stack that needs to be patterned, exposing the photoresist material to a pattern of irradiation and developed the exposed photoresist. Etching may include dry etching, wet etching or any combination thereof. The drying etching and/or the wet etching may include a single etch or multiple etching steps. In one embodiment, the etching used to pattern the material stack includes ion beam etching. In such an embodiment, an undulating surface 11 is formed into an upper portion of the interconnect dielectric material layer 10. It is noted that the etch used in providing the memory device pillar 18 and the top electrode 20 may also etch the bottom electrode 18 such that the bottom electrode 18 has tapered sidewalls as shown in FIG. 1.

Each memory device pillar 18 can be used to provide a non-volatile memory device array such as, for example, a ferroelectric memory (FE) device array, a resistive random access memory (ReRAM) device array, a magnetoresistive random access memory (MRAM) device array, or a phase change random access memory (PRAM) device array.

A FE memory device is a random access memory similar in construction to a DRAM by using a ferroelectric layer instead of a dielectric layer to achieved non-volatility. Thus, the memory device pillar 18 may include a ferroelectric layer which is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y. The ferroelectric layer of the FE memory device can be formed utilizing a deposition process.

A ReRAM device is a random access memory that typically includes a metal oxide that can exhibit a change in electron localization. Thus, the memory device pillar 18 may include a metal oxide such as, for example, oxides of nickel, zirconium, hafnium, iron, or copper. The metal oxide which can be used in the memory device pillar 18 can be formed utilizing a deposition process.

A MRAM device is a random access memory that includes a magnetic tunnel junction (MTJ) structure. Thus, the memory device pillar 18 may include a multilayered magnetic tunnel junction (MTJ) material stack that may include a magnetic reference layer, a tunnel barrier, a magnetic free layer, and a MTJ cap. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the multilayered MTJ material stack is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators. The magnetic free layer of the multilayered MTJ material stack is composed of a magnetic material with a magnetization that can be changed in orientation relative to the magnetization orientation of the reference layer. Exemplary materials for the magnetic free layer include alloys and/or multilayers of cobalt, iron, alloys of cobalt-iron, nickel, alloys of nickel-iron, and alloys of cobalt-iron-boron. The MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides.

The multilayered MTJ material stack that can be used as the memory device pillar 18 can be formed by deposition of the various material layers.

A PRAM device is a random access memory that typically includes a phase change memory material that exhibits a change in atomic order (from crystalline to amorphous or vice versa). Thus, the memory device pillar 18 may include a phase change memory material. Exemplary phase change materials include, but are not limited to, a chalcogenide glass example, $Ge_2Sb_2Te_5$ or $Ge_2Bi_2Te_6$. The phase change memory material which can be used in the memory device pillar 18 can be formed by deposition.

The top electrode 20 may include one of the conductive materials mentioned above for the bottom electrode 16. In one embodiment, the top electrode 20 is composed of a same conductive material as the bottom electrode 16. In another embodiment, the top electrode 20 may be composed of a compositionally different conductive material than the bottom electrode 16. The conductive material that provides the top electrode 20 can be formed utilizing one of the deposition processes mentioned above for forming the conductive material that provides the bottom electrode 16.

Figure 2:
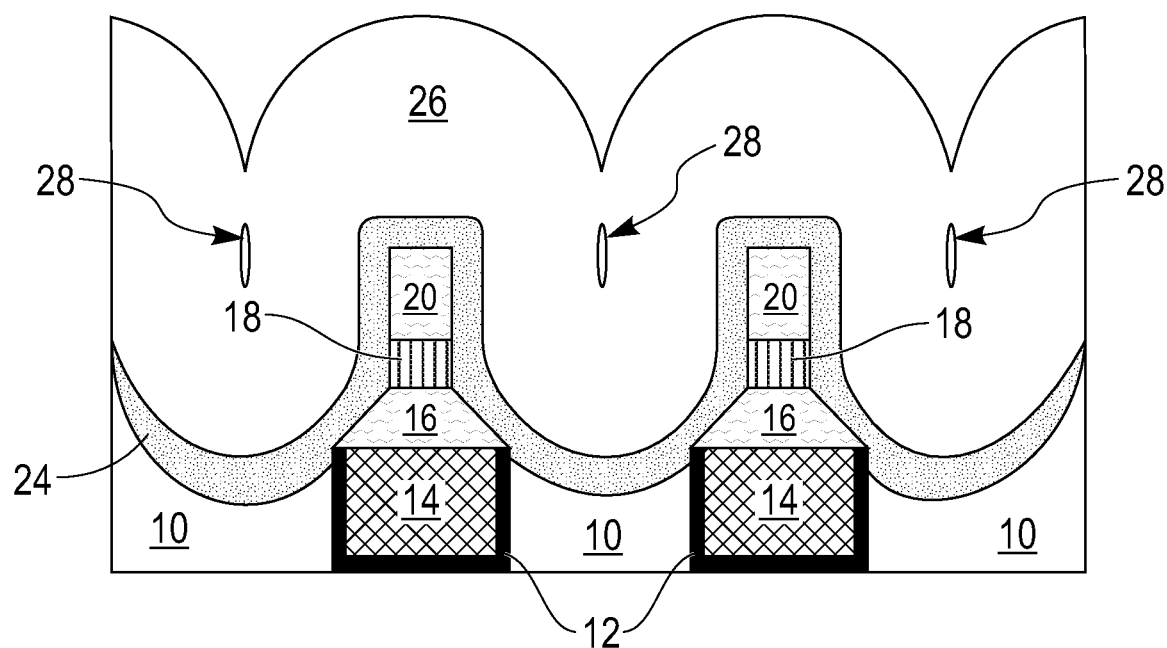
FIG. 2 is a cross sectional view of the exemplary semiconductor structure of FIG. 1 after forming a passivation dielectric material layer on physically exposed surfaces of the plurality of memory device stacks and a first interlayer dielectric (ILD) material having a low dielectric constant and voids on the passivation dielectric material layer.

Referring now to FIG. 2, there is illustrated the exemplary semiconductor structure of FIG. 1 after forming a passivation dielectric material layer 24 on physically exposed surfaces of the plurality of memory device stacks (16/18/20) and a first interlayer dielectric (ILD) material 26 having a low dielectric constant and voids 28 on the passivation dielectric material layer 24. The term "low-dielectric constant" or "k" as used throughout the present application denotes a dielectric material that has a dielectric constant of less than 4.0. As is shown, the first ILD material 26 fills in the gap that is located between each memory device stack (16/18/20) of the plurality of memory device stacks. Also, the voids 28 that are present in the first ILD material 26 are located within the gaps. The voids 28 are generated by the near pinch off conditions provided by gap located between each memory device stack (16/18/20).

As is shown, the passivation dielectric material layer 24 is a continuous layer that is formed upon the topmost surface of the interconnect dielectric material layer 10 and along the sidewalls and topmost surface of each memory device stack (16/18/20). In one embodiment, the passivation dielectric material layer 24 is composed of silicon nitride. Other dielectric materials that can serve to passivate the memory device stacks (16/18/20) may also be used in the present application. The passivation dielectric material layer 24 can be formed utilizing a deposition process such as, for example, CVD, PECVD, PVD, or ALD. The passivation dielectric material layer 24 may have a thickness from 10 nm to 200 nm. Other thicknesses are possible and can be employed as the thickness of the passivation dielectric material layer 24.

The first ILD material 26 having voids 28 may be composed of a chemical vapor deposition (CVD) low-k dielectric material. The first ILD material 26 is compositionally different from the dielectric material that provides the passivation dielectric material layer 24. Illustrated examples of such CVD low-k dielectric materials include, but are not limited to, dielectric materials that contain atoms of silicon, carbon and hydrogen. When the interconnect dielectric material layer 10 has an undulating surface 11, the first ILD material 26 also has an undulating surface as shown in FIG. 2.

Figure 3:
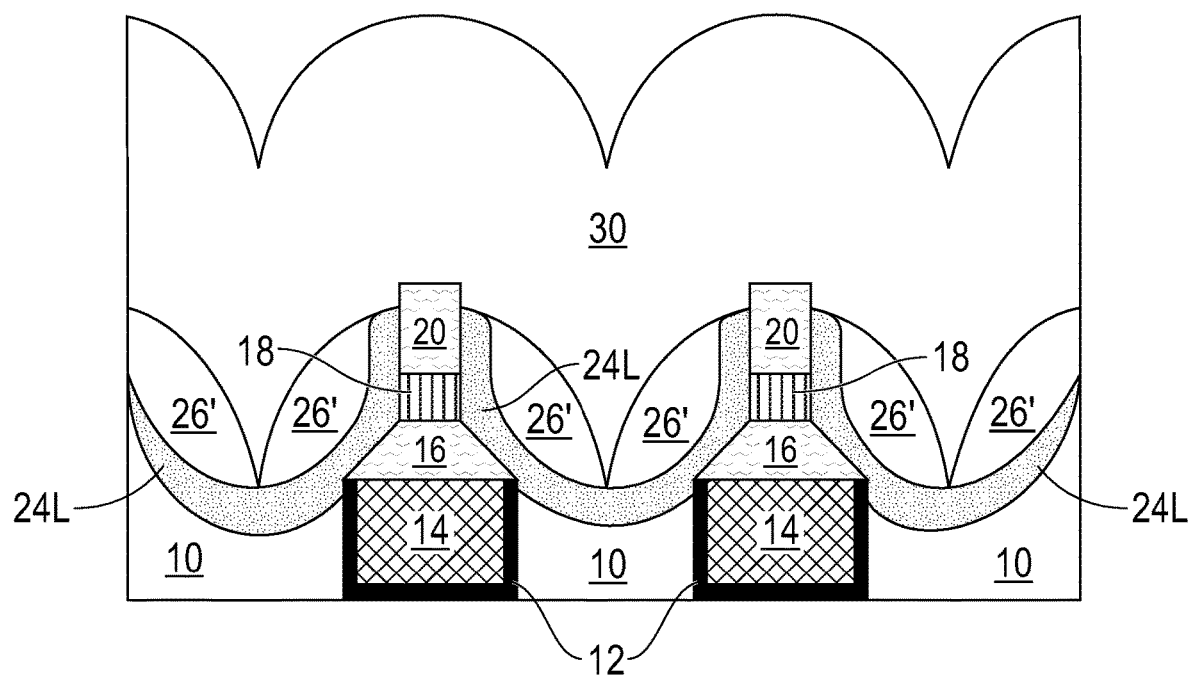
FIG. 3 is a cross sectional view of the exemplary semiconductor structure of FIG. 2 after etching the first ILD material and the passivation dielectric material layer, and forming a second ILD material having a low dielectric constant.

Referring now to FIG. 3, there is shown the exemplary semiconductor structure of FIG. 2 after etching the first ILD material 26 and the passivation dielectric material layer 24, and forming a second ILD material 30 having a low dielectric constant.

The etching of the first ILD material 26 and the passivation dielectric material layer 24 may be performed utilizing a spacer etching process including, for example, reactive ion etching. Notably, and in this embodiment, the etch removes an upper portion of the first ILD material 26 including the voids 28 that are located in the gaps between each of the memory device stacks (16/18/20) as well as a portion of the passivation dielectric material layer 26 that is located on a topmost surface and an upper sidewall surface of the top electrode. The first ILD material 26 that remains is located adjacent to each memory device stacks (16/18/20) and is void free. The remaining first ILD material thus may be referred to a void free first low-k ILD material 26'. The void free first low-k ILD material 26' may have an undulating surface as shown in FIG. 3. The remaining passivation dielectric material layer may be referred to herein as a passivation dielectric material liner 24L.

The second ILD material 30 having the low dielectric constant may include one of the dielectric materials mentioned above for the first ILD material 26. In one embodiment, the second ILD material 30 is a same low-k ILD material as the first ILD material 26. In another embodiment, the second ILD material 30 may be composed of a compositionally different low-k dielectric material than the first ILD material 26. The second ILD material 30 may be formed utilizing a CVD process. The second ILD material 30 is void free since pinch off is not an issue due to the presence of the first ILD material, and the second ILD material 30 has a surface that is in physically contact with physically exposed surfaces of each memory device stack (16/18/20). The second ILD material 30 may thus be referred to as a second void free low-k ILD material. At this point of the present application, the second ILD material (i.e., the second void free low-k ILD material) 30 has an undulating surface as shown in FIG. 3.

Collectively, the first void free low-k ILD material 26' and the second void free low-k (ILD) material 30 provide a dual interlayer dielectric material structure of the present application. In this embodiment, the first void free low-k ILD material 26' is composed of a single ILD material having a low dielectric constant.

Notably, FIG. 3 illustrates an exemplary structure in accordance with a first embodiment of the present application. The exemplary structure of FIG. 3 includes a memory device stack (16/18/20) located on a surface of each electrically conductive structure 14 of a plurality of electrically conductive structures that is embedded in an interconnect dielectric material layer 10. Each memory device stack includes a bottom electrode 16, a memory device pillar 18 and a top electrode 20. A passivation dielectric material liner 24L is located laterally adjacent to each memory device stack (16/18/20) and on a surface of the interconnect dielectric material layer 10. A dual interlayer dielectric material structure (26'/30) is located on the passivation dielectric material liner 24L and entirely fills a gap between each memory device stack (16/18/20). The dual interlayer dielectric material structure includes, from bottom to top, a first void free low-k interlayer dielectric (ILD) material 26' and a second void free low-k ILD material 30. In this embodiment, the first void free low-k ILD material 26' is composed of a single ILD material having a low dielectric constant and an undulating top surface. The second ILD material 30 can be planarized by CMP for further BEOL processes.

Figure 4:
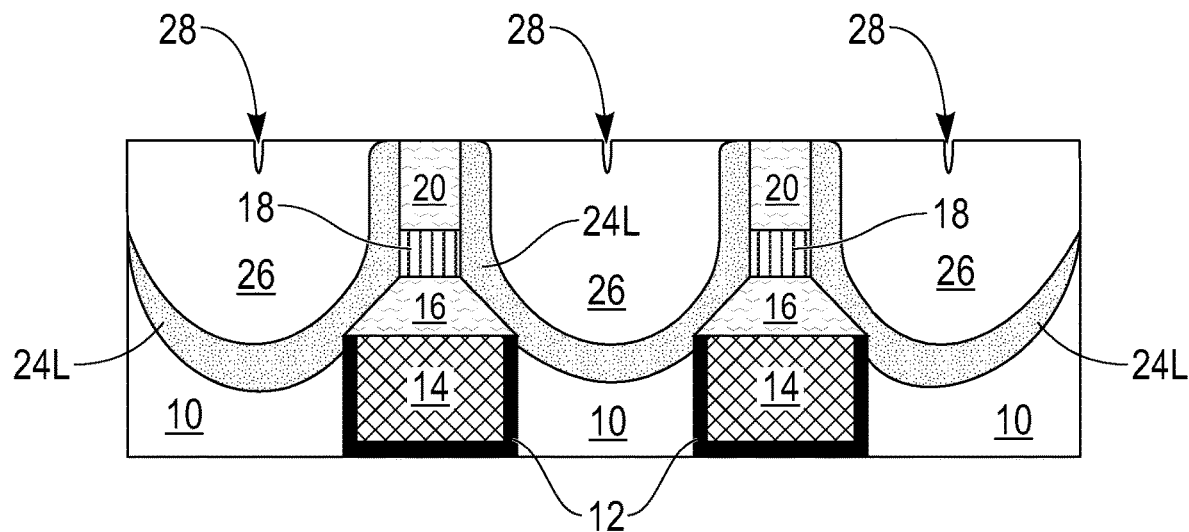
FIG. 4 is a cross sectional view of the exemplary semiconductor structure of FIG. 2 after performing a planarization process that stops on a topmost surface of the top electrode of each memory device stack, wherein each void in the first ILD material is physically exposed.

Referring now to FIG. 4, there is illustrated the exemplary semiconductor structure of FIG. 2 after performing a planarization process that stops on a topmost surface of the top electrode 20 of each memory device stack (16/18/20), wherein each void 28 in the first ILD material 26 is physically exposed. The planarization process may include chemical mechanical polishing (CMP) or grinding. The planarization process removes an upper portion of the first ILD material 26 as well as a portion of the passivation dielectric material layer 24 that are located above the topmost surface of the top electrode 20 of each memory device stack (16/18/20).

Figure 5:
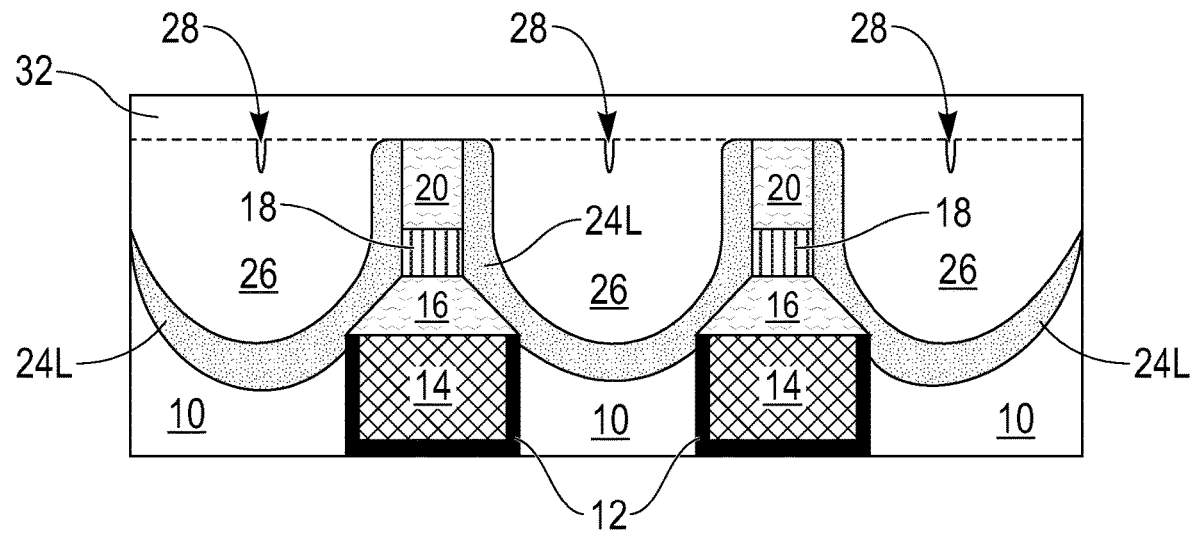
FIG. 5 is a cross sectional view of the exemplary semiconductor structure of FIG. 4 after filling each void with a same dielectric material as the first ILD material.

Referring now to FIG. 5, there is illustrated the exemplary semiconductor structure of FIG. 4 after filling each void 28 with a same dielectric material as the first ILD material 26. The dielectric material that fills the voids may be referred to herein as a void filling low-k dielectric material 32. In the drawing, the dotted line shows an imaginary interface between the planarization first ILD material 26 and the void filling low-k dielectric material 32. The void filling low-k dielectric material 32 may be formed by atomic layer deposition. The void filling low-k dielectric material 32 may have a thickness from 5 nm to 20 nm. Other thicknesses are possible for the void filling low-k dielectric material 32 as long as the thickness of the void filling low-k dielectric material 32 is sufficient to fill in each of the voids 28. Typically, the void filling low-k dielectric material 32 is formed upon the physically exposed topmost surface of the top electrode 20 of each memory device stack (16/18/20).

Figure 6:
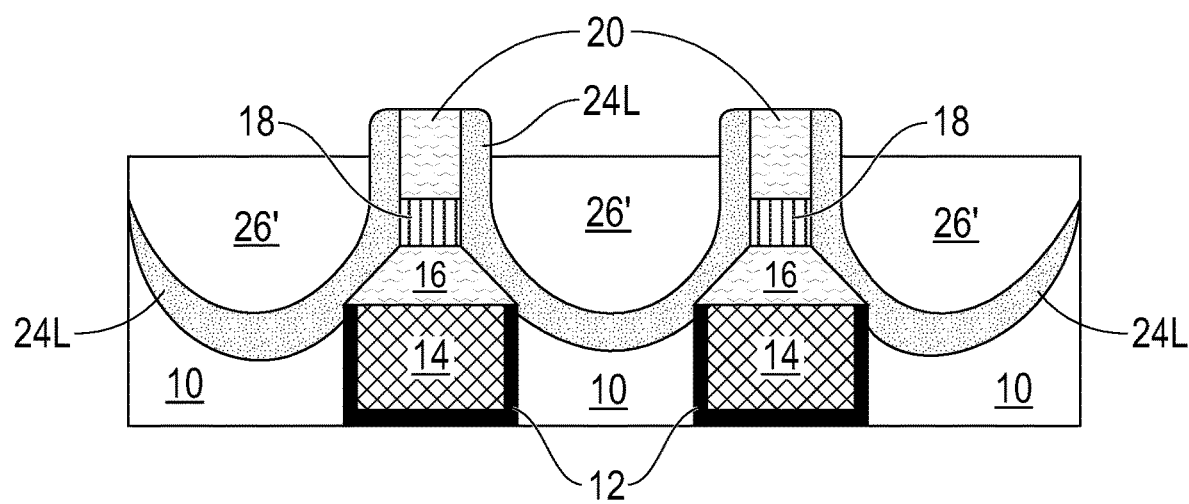
FIG. 6 is a cross sectional view of the exemplary semiconductor structure of FIG. 5 after performing a recess etch.
Figure 7:
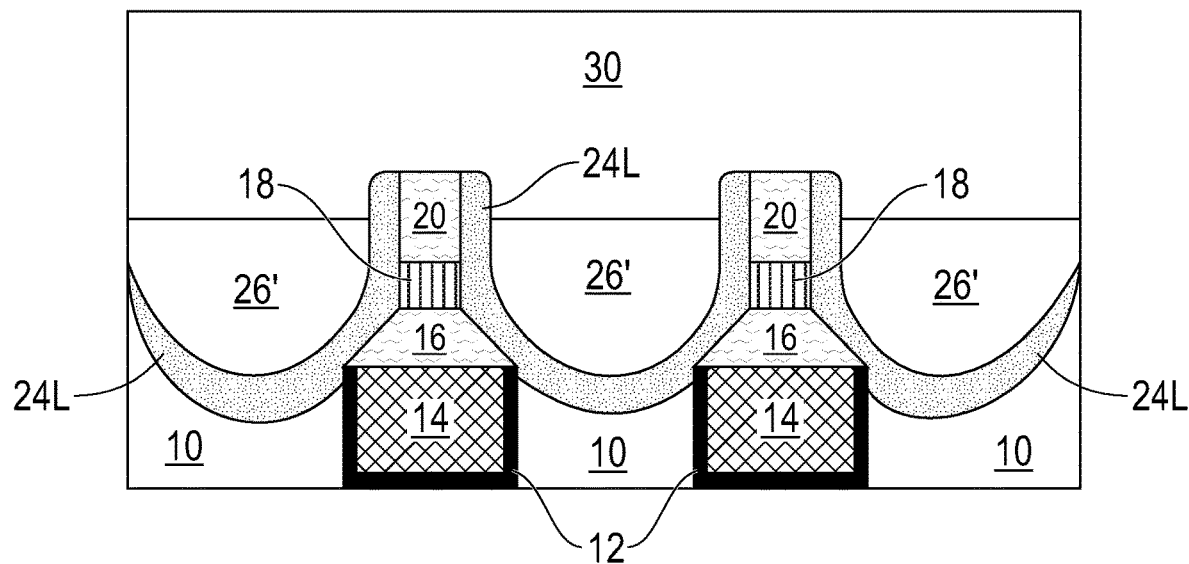
FIG. 7 is a cross sectional view of the exemplary semiconductor structure of FIG. 6 after forming a second ILD material having a low dielectric constant.

Referring now to FIG. 6, there is illustrated the exemplary semiconductor structure of FIG. 5 after performing a recess etch. The recess etch re-exposes the topmost surface of the top electrode 20 of each memory device stack (16/18/20). The recess etch thus removes the void filling low-k dielectric material 32 that is present outside each of the voids 28 and present above the top electrode 20 of each memory device stack (16/18/20) The recess etch may include a reactive ion etch or a wet etch process. In FIG. 6, the planarized first ILD material 26 including the void filling low-k dielectric material 32 present in each of the voids 28 can be referred to herein as a void free first low-k ILD material 26'. Referring now to FIG. 7, there is illustrated the exemplary semiconductor structure of FIG. 6 after forming a second ILD material 30 having a low dielectric constant. The second ILD material 30 of this embodiment of the present application is the same as described above for the previous embodiment of the present application.

Notably, FIG. 7 illustrates an exemplary structure in accordance with a second embodiment of the present application. The exemplary structure of FIG. 7 includes a memory device stack (16/18/20) located on a surface of each electrically conductive structure 14 of a plurality of electrically conductive structures that are embedded in an interconnect dielectric material layer 10. Each memory device stack includes a bottom electrode 16, a memory device pillar 18 and a top electrode 20. A passivation dielectric material liner 24L is located laterally adjacent to each memory device stack (16/18/20) and on a surface of the interconnect dielectric material layer 10. A dual interlayer dielectric material structure (26'/30) is located on the passivation dielectric material liner 24L and entirely fills a gap between each memory device stack (16/18/20). The dual interlayer dielectric material structure includes, from bottom to top, a first void free low-k interlayer dielectric (ILD) material 26' and a second void free low-k ILD material 30. In this embodiment, the first void free low-k interlayer dielectric (ILD) material 26' is composed of a void filling low-k dielectric material 32 filling an entirety of each void 28 present in a first ILD material 26 having a low dielectric constant. The second ILD material 30 can be planarized by CMP for further BEOL processes.

Figure 8:
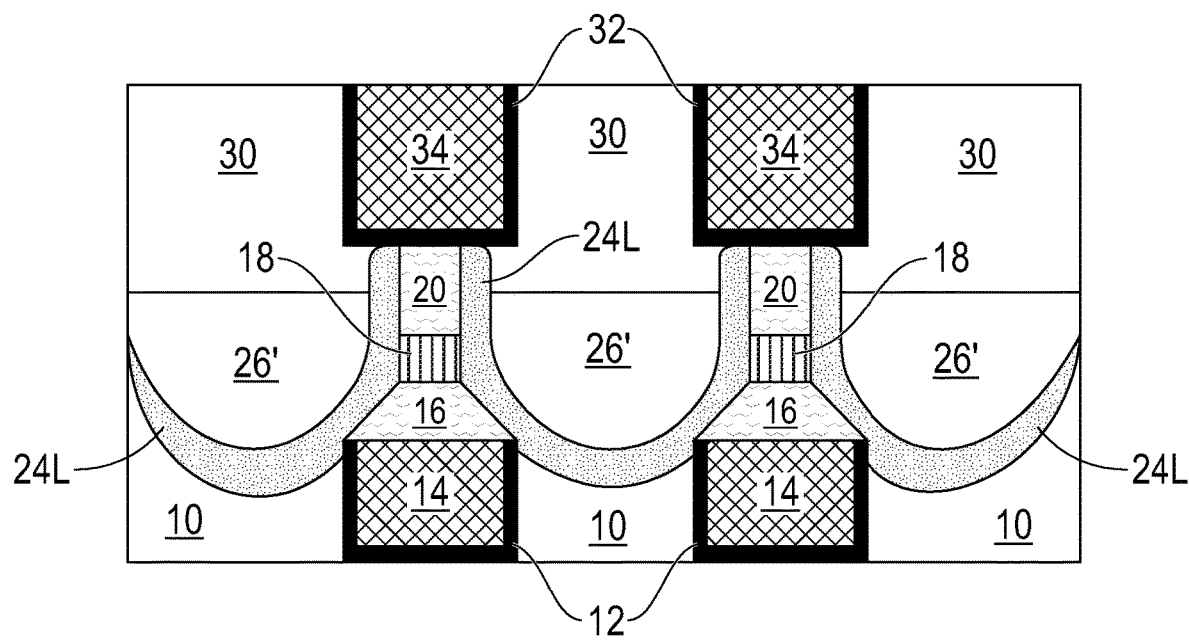
FIG. 8 is a cross sectional view of the exemplary semiconductor structure of FIG. 7 after further device processing.

Referring now to FIG. 8, there is illustrated the exemplary semiconductor structure of FIG. 7 after further device processing. The same device processing may be performed on the exemplary semiconductor structure shown in FIG. 3.

Notably, the further device processing including forming openings into the second ILD material 30 to physically expose a surface of the top electrode 20 of each memory device stack (16/18/20). A second diffusion barrier liner 32 and second electrically conductive structures 34 are then formed into each of the openings. In some embodiments, the second diffusion barrier liner 32 can be omitted. Each second diffusion barrier liner 32 and the second electrically conductive structure 34 can be formed by deposition of a diffusion barrier material layer and an electrically conductive metal or metal alloy layer, and then performing a planarization process to remove the diffusion barrier material layer and the electrically conductive metal or metal alloy layer that is present outside the openings and above the topmost surface of the second ILD material 30.

Each second diffusion barrier liner 32 may include one of the diffusion barrier materials mentioned above for diffusion barrier liner 12. In one embodiment, each second diffusion barrier liner 32 is composed of a same diffusion barrier material as the diffusion barrier liners 12. In another embodiment, each second diffusion barrier liner 32 is composed of a different diffusion barrier material than the diffusion barrier liners 12. A diffusion barrier material layer that provides each second diffusion barrier liner 32 may be deposited utilizing one of the deposition processes mentioned above in forming the diffusion barrier liner 12. Each second diffusion barrier liner 32 may have a thickness within the thickness range mentioned above for the diffusion barrier liner 12.

Each second electrically conductive structure 34 may include one of the electrically conductive metals or metal alloys mentioned above for the each electrically conductive structure 14. In one embodiment, each second electrically conductive structure 34 is composed of a same electrically conductive metal or metal alloy as each electrically conductive structure 14. In another embodiment, each second electrically conductive structure 34 is composed of a different electrically conductive metal or metal alloy than each electrically conductive structure 14. The electrically conductive metal or metal alloy that provides the each second electrically conductive structure 32 may be deposited utilizing one of the deposition processes mentioned above in forming each electrically conductive structure 14.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a plurality of electrically conductive structures embedded in an interconnect dielectric material layer and present in a memory device area;
   a memory device stack located on a surface of each electrically conductive structure of the plurality of electrically conductive structures, wherein each memory device stack includes a bottom electrode, a memory device pillar and a top electrode;
   a passivation dielectric material liner located laterally adjacent to each memory device stack and on a surface of the interconnect dielectric material layer; and
   a dual interlayer dielectric material structure located on the passivation dielectric material liner and entirely filling a gap between each memory device stack, wherein the dual interlayer dielectric material structure includes, from bottom to top, a first void free low-k interlayer dielectric (ILD) material and a second void free low-k ILD material.

2. The semiconductor structure of claim 1, wherein the first void free low-k ILD material is composed of a single ILD material having a low dielectric constant and an undulating top surface.

3. The semiconductor structure of claim 1, wherein the first void free low-k interlayer dielectric (ILD) material is composed of a void filling low-k dielectric material filling an entirety of each void present in a first ILD material having a low dielectric constant.

4. The semiconductor structure of claim 3, wherein the void filling low-k dielectric material is composed of a same low-k dielectric material as the first ILD material.

5. The semiconductor structure of claim 1, wherein the surface of the interconnect dielectric material is an undulating surface.

6. The semiconductor structure of claim 1, wherein the memory device pillar is a ferroelectric memory (FE) device pillar, a resistive random access memory (ReRAM) device pillar, a magnetoresistive random access memory (MRAM) device pillar, or a phase change random access memory (PRAM) device pillar.

7. The semiconductor structure of claim 1, wherein the memory device pillar is a MRAM device pillar comprising a magnetic reference layer, a tunnel barrier layer, a magnetic free layer and a cap layer.

8. The semiconductor structure of claim 1, wherein the bottom electrode and the top electrode are composed of a conductive material.

9. The semiconductor structure of claim 8, wherein the conductive material comprises Ta, TaN, Ti, TiN, Ru, RuN, RuTa, RuTaN, Co, CoWP, CoN, W, WN or any combination thereof.

10. The semiconductor structure of claim 1, further comprising a plurality of second electrically conductive structures embedded in the second void free low-k ILD material of the dual interlayer dielectric material structure, wherein each second electrically conductive structure contacts a surface of one of the top electrodes of the memory device stacks.

* * * * *